US010439012B2

(12) United States Patent
Rho

(10) Patent No.: US 10,439,012 B2
(45) Date of Patent: Oct. 8, 2019

(54) DISPLAY DEVICE

(71) Applicant: Samsung Display Co., Ltd., Yongin-si, Gyeonggi-do (KR)

(72) Inventor: Soo Guy Rho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/105,796

(22) Filed: Aug. 20, 2018

(65) Prior Publication Data

US 2019/0157362 A1    May 23, 2019

(30) Foreign Application Priority Data

Nov. 21, 2017    (KR) .......................... 10-2017-0155428

(51) Int. Cl.
*H01L 27/32* (2006.01)
*H01L 51/50* (2006.01)
*H01L 51/52* (2006.01)

(52) U.S. Cl.
CPC ........ *H01L 27/3246* (2013.01); *H01L 51/502* (2013.01); *H01L 51/5036* (2013.01); *H01L 51/5203* (2013.01); *H01L 51/5268* (2013.01); *H01L 51/5271* (2013.01); *H01L 27/3262* (2013.01)

(58) Field of Classification Search
CPC ............. H01L 27/3246; H01L 51/5203; H01L 51/5036; H01L 51/502; H01L 51/5271; H01L 51/5268; H01L 27/3262
See application file for complete search history.

(56) References Cited

U.S. PATENT DOCUMENTS

| | | | |
|---|---|---|---|
| 2015/0187857 A1* | 7/2015 | Negishi | ............... H01L 27/3272 257/40 |
| 2016/0223863 A1* | 8/2016 | Mizunuma | ........ G02F 1/133617 |
| 2016/0247863 A1* | 8/2016 | Choung | .............. H01L 27/3246 |
| 2017/0098690 A1* | 4/2017 | Lee | ..................... H01L 51/5275 |
| 2018/0011385 A1* | 1/2018 | Kang | .................. H01L 51/5281 |
| 2018/0019439 A1* | 1/2018 | Lee | ..................... H01L 27/3262 |

FOREIGN PATENT DOCUMENTS

| | | |
|---|---|---|
| JP | 2005-071920 A | 3/2005 |
| KR | 10-2010-0043943 A | 4/2010 |
| KR | 10-2015-0131962 A | 11/2015 |
| KR | 10-2016-0013443 A | 2/2016 |
| KR | 10-2017-0077929 A | 7/2017 |

* cited by examiner

*Primary Examiner* — Victor A Mandala
(74) *Attorney, Agent, or Firm* — Lewis Roca Rothgerber Christie LLP

(57) ABSTRACT

A display device includes: a substrate; a switching element on the substrate; an insulating layer on the switching element; a pixel defining film on the insulating layer and including an opening overlapping a part of the insulating layer; a lower electrode on a side surface of the pixel defining film defining the opening and electrically connected with the switching element; a reflective pattern on the insulating layer exposed through the opening and spaced apart from the lower electrode; a light emitting layer on the lower electrode and the reflective pattern; an upper electrode on the light emitting layer; and a wavelength conversion layer on the upper electrode and arranged in the opening.

20 Claims, 13 Drawing Sheets

DISPLAY DEVICE

CROSS-REFERENCE TO RELATED APPLICATION

This application claims priority to and the benefit of Korean Patent Application No. 10-2017-0155428, filed on Nov. 21, 2017 in the Korean Intellectual Property Office, the entire disclosure of which is incorporated herein by reference.

BACKGROUND

1. Field

Aspects of embodiments of the present invention relate to a display device.

2. Description of the Related Art

An organic light emitting display device includes a hole injection electrode, an electron injection electrode, and an organic light emitting layer formed therebetween, and is a self-emission type display device configured such that holes injected from the hole injection electrode are combined with electrons injected from the electron injection electrode to generate excitons, and the excitons are transitioned from an excited state to a ground state, thereby emitting light.

The organic light emitting display device, which is a self-emission type display device, can be driven with a low voltage and made thin and light because a separate light source is not necessary, and the application range thereof is increasing from personal portable appliances, such as MP3 players and mobile phones, to televisions (TVs) because it has a wide viewing angle, a high contrast, and a high response speed.

The organic light emitting display device can display an image using three primary colors of red, green, and blue.

Some organic light emitting display devices implement red, green, and blue (RGB) colors using a combination of a white organic light emitting layer with a red color filter, a green color filter, and a blue color filter.

SUMMARY

In the case of the above-described organic light emitting display device using a white organic light emitting layer and color filters, there are disadvantages in terms of light efficiency and color reproducibility due to the use of color filters.

According to an aspect of embodiments of the present invention, a display device has improved light efficiency and color reproducibility.

However, aspects of the present invention are not limited to the above aspect. The above and other aspects of the present invention will become more apparent to one of ordinary skill in the art to which the present invention pertains by referencing the description of the present invention provided below.

According to one or more embodiments, a display device includes: a substrate; a switching element disposed on the substrate; an insulating layer disposed on the switching element; a pixel defining film disposed on the insulating layer and including an opening overlapping a part of the insulating layer; a lower electrode disposed on a side surface of the pixel defining film defining the opening and electrically connected with the switching element; a reflective pattern disposed on the insulating layer exposed through the opening and spaced apart from the lower electrode; a light emitting layer disposed on the lower electrode and the reflective pattern; an upper electrode disposed on the light emitting layer; and a wavelength conversion layer disposed on the upper electrode and disposed in the opening.

According to one or more embodiments, a display device includes: a substrate including a first pixel area and a second pixel area adjacent to the first pixel area; a first switching element disposed on the substrate and disposed in the first pixel area; a second switching element disposed on the substrate and disposed in the second pixel area; an insulating layer disposed on the first switching element and the second switching element; a pixel defining film disposed on the insulating layer and including a first side surface defining a first opening exposing a part of the insulating layer in the first pixel area and a second side surface defining a second opening exposing a part of the insulating layer in the second pixel area; a first lower electrode disposed on the first side surface and electrically connected with the first switching element; a second lower electrode disposed on the second side surface and electrically connected with the second switching element; a first reflective pattern disposed on the insulating layer exposed through the first opening and spaced apart from the first lower electrode; a second reflective pattern disposed on the insulating layer exposed through the second opening and spaced apart from the second lower electrode; a light emitting layer disposed on the first lower electrode, the second lower electrode, the first reflective pattern, and the second reflective pattern; an upper electrode disposed on the light emitting layer; a first wavelength conversion layer disposed on the upper electrode and disposed in the first opening; and a second wavelength conversion layer disposed on the upper electrode and disposed in the second opening.

The present invention is not limited to the aforementioned embodiments, and other embodiments, which are not mentioned above, will be apparent to a person having ordinary skill in the art from the following description.

Details of other exemplary embodiments will be included in the detailed description of the invention and the accompanying drawings.

BRIEF DESCRIPTION OF THE DRAWINGS

The above and other aspects and features of the present invention will become more apparent by describing in further detail some exemplary embodiments thereof with reference to the attached drawings, in which.

DETAILED DESCRIPTION

Figure 1:
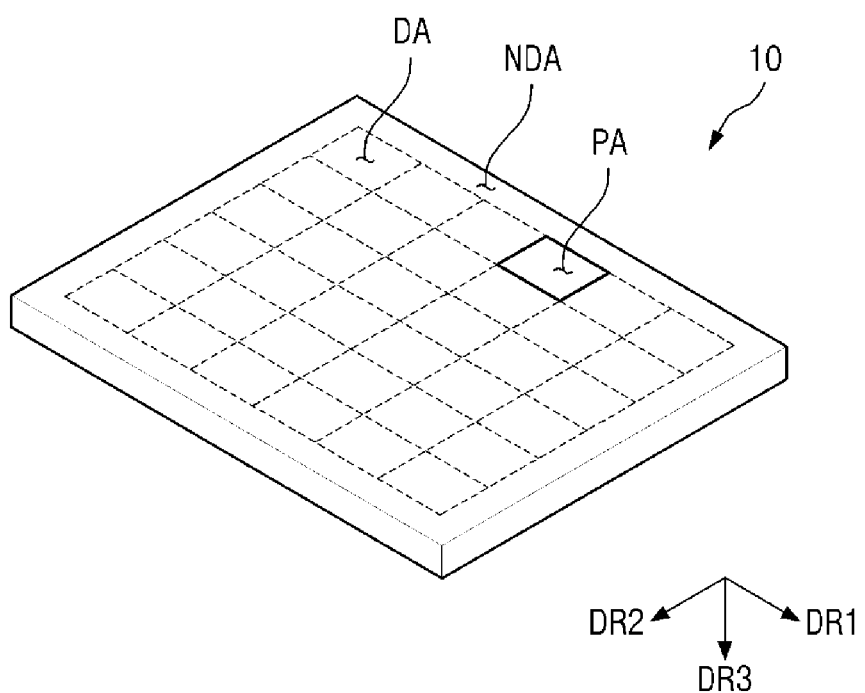
FIG. 1 is a perspective view of a display device according to an embodiment.

Aspects and features of the inventive concept and methods of accomplishing the same may be understood more readily by reference to the following detailed description of some embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will be defined by the appended claims. Like reference numerals refer to like elements throughout the specification.

The terminology used herein is for the purpose of describing particular embodiments and is not intended to be limiting of the inventive concept. As used herein, the singular forms "a," "an," and "the" are intended to include the plural forms as well, unless the context clearly indicates otherwise. It is to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is to be understood that when an element or layer is referred to as being "on," "connected to," or "coupled to" another element or layer, it can be directly on, connected, or coupled to the other element or layer or one or more intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

Herein, some embodiments of the present invention will be described with reference to the attached drawings.

FIG. 1 is a perspective view of a display device according to an embodiment.

Referring to FIG. 1, a display device 10 may be applied to any of various electronic appliances, such as tablet PCs, smartphones, vehicle navigation units, cameras, center information displays (CIDs) for vehicles, wrist watch-type electronic devices, personal digital assistant (PDAs), portable multimedia players (PMPs), game machines, televisions, outside billboards, monitors, personal computers, and notebook computers. These appliances are provided only as examples, and it is to be understood that the display device can be applied to other electronic appliances as long as it does not depart from the concept of the present invention.

In some embodiments, the display device 10 may have a rectangular shape on a plane. The display device 10 may include both short sides extending in one direction and both long sides extending in another direction crossing the one direction. The corner where the long side and short side of the display device 10 meet each other may be a right angle, but is not limited thereto, and may have a curved surface. The planar shape of the display device 10 is not limited to the illustrated shape, and may have a circular shape or another shape.

The display device 10 may include a display area DA and a non-display area NDA, and may display an image through the display area DA. The display area DA may have a substantially rectangular shape when viewed in a third direction DR3, which is a thickness direction of the display device 10. However, the present invention is not limited thereto.

The display area DA may include a plurality of pixel areas PA. The plurality of pixel areas PA may be arranged in a matrix form. A pixel PX (see FIG. 2) may be disposed in the pixel area PA.

The non-display area NDA does not display an image. When viewed in the third direction DR3 of the display device 10, the non-display area NDA, for example, may be disposed to surround the display area DA. In an embodiment, the non-display area NDA may be adjacent to the display area DA in a first direction DR1 and a second direction DR2 crossing the first direction DR1.

Figure 2:
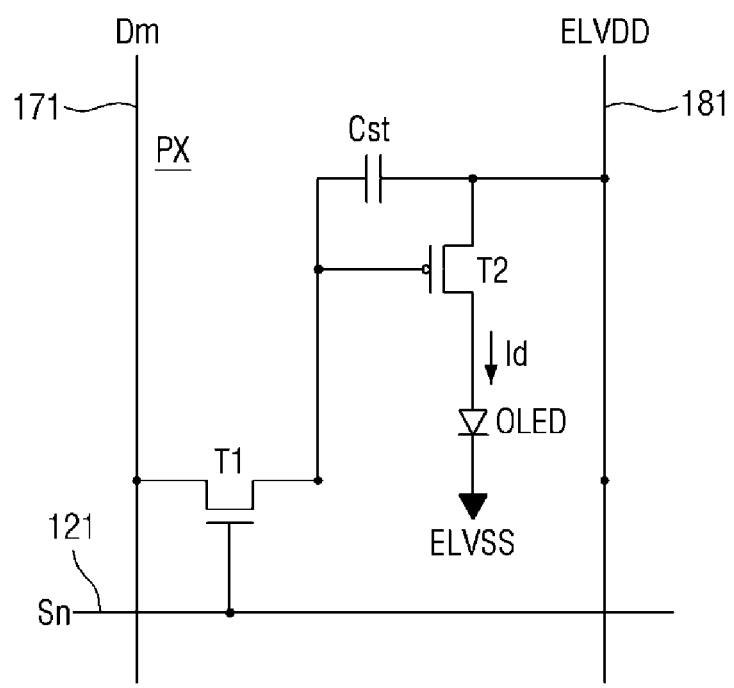
FIG. 2 is a circuit diagram of a pixel located in a pixel area in the display device according to an embodiment.

FIG. 2 is a circuit diagram of a pixel of the pixels included in the display device according to an embodiment.

Referring to FIG. 2, a pixel PX includes a plurality of signal lines 121, 171, and 181, a plurality of switching elements T1 and T2 connected to the plurality of signal lines 121, 171, and 181, a storage capacitor Cst, and an organic light emitting diode OLED.

The switching elements T1 and T2 include a switching transistor T1 and a driving transistor T2.

The signal lines 121, 171, and 181 include a plurality of gate lines 121 transmitting gate signals Sn (scan signal), a plurality of data lines 171 crossing the gate lines and transmitting data signals Dm, and a plurality of driving voltage lines 181 transmitting a driving voltage ELVDD and disposed substantially in parallel with the plurality of data lines 171.

The switching transistor T1 may include a control terminal, an input terminal, and an output terminal. The control terminal of the switching transistor T1 is connected to the gate line 121, the input terminal thereof is connected to the data line 171, and the output terminal thereof is connected to the driving transistor T2. The switching transistor T1 transmits the data signal Dm applied to the data line 171 to the driving transistor T2 in response to the gate signal Sn applied to the gate line 121.

The driving transistor T2 may also include a control terminal, an input terminal, and an output terminal. The control terminal of the driving transistor T2 is connected to the switching transistor T1, the input terminal thereof is connected to the driving voltage line 181, and the output terminal thereof is connected to the organic light emitting diode OLED. The driving transistor T2 flows a driving current Id whose magnitude varies depending on the voltage applied between the control terminal and the output terminal.

The storage capacitor Cst is connected between the control terminal and input terminal of the driving transistor T2. The storage capacitor Cst charges the data signal applied to the control terminal of the driving transistor T2 and maintains this data signal even after the switching transistor T1 is turned off.

The organic light emitting diode OLED includes an anode electrode connected to the output terminal of the driving transistor T2 and a cathode electrode connected to a common voltage ELVSS. The organic light emitting diode OLED displays an image by emitting light with different intensity according to the driving current Id of the driving transistor T2.

In an embodiment, each of the switching transistor T1 and the driving transistor T2 may be an n-channel field effect transistor (FET) or a p-channel field effect transistor (FET). However, the connection relationship between the switching elements T1 and T2, the storage capacitor Cst, and the organic light emitting diode OLED can be variously changed.

Figure 3:
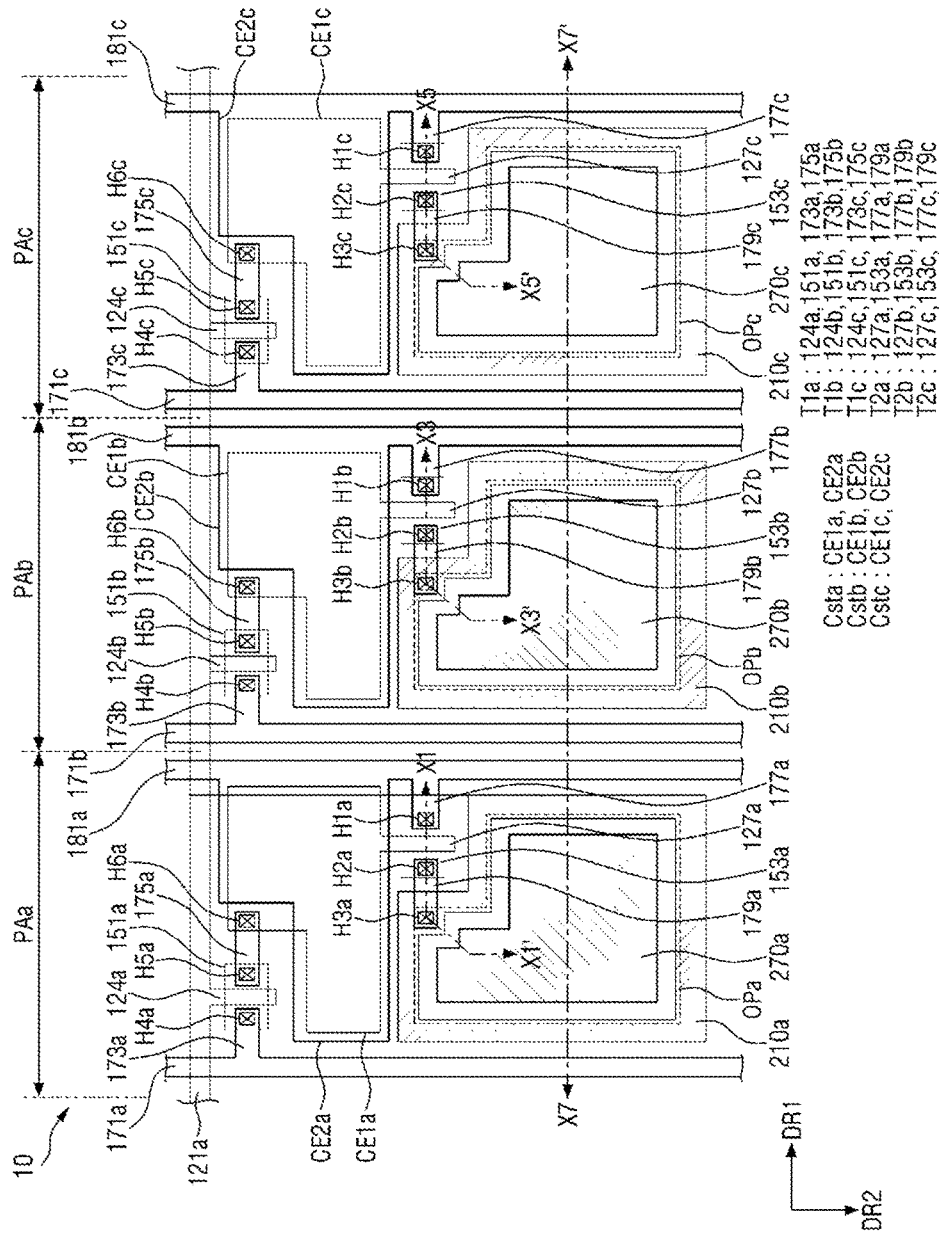
FIG. 3 is a plan view showing a structure of three pixel areas of the display device according to an embodiment.
Figure 4:
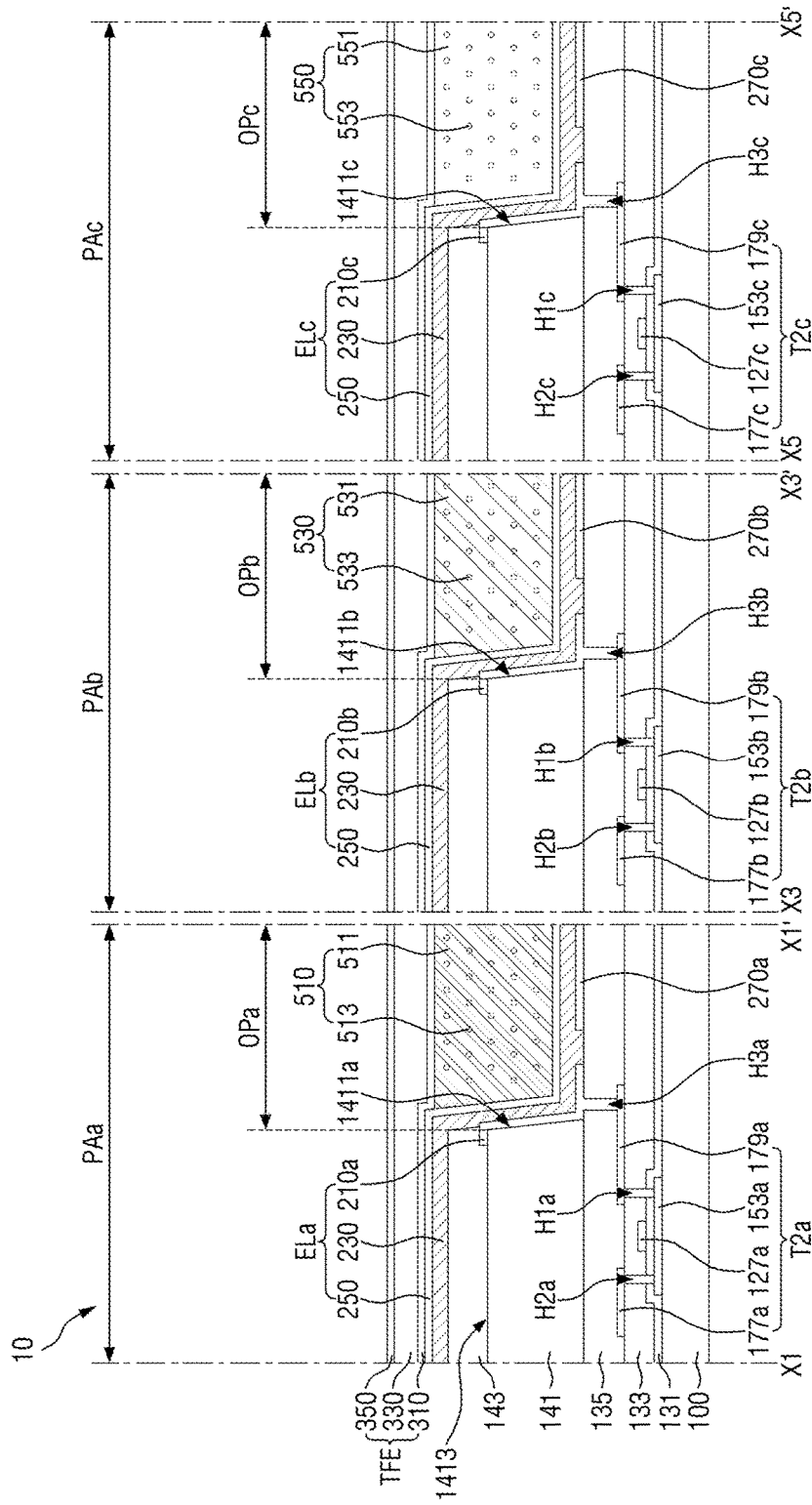
FIG. 4 is a cross-sectional view taken along the lines X1-X1', X3-X3', and X5-X5' in FIG. 3.
Figure 5:
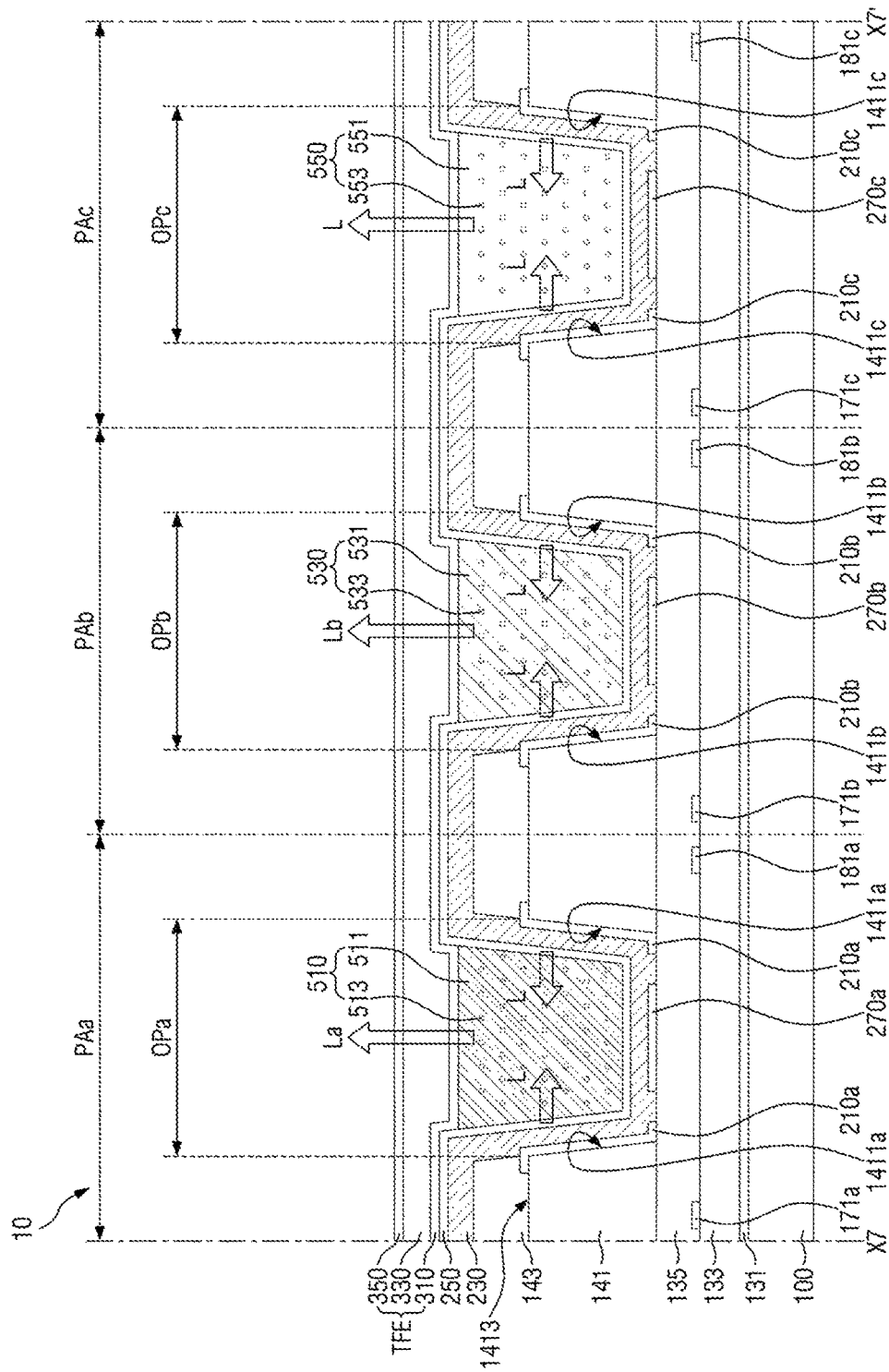
FIG. 5 is a cross-sectional view taken along the line X7-X7' in FIG. 3'.

FIG. 3 is a plan view showing a structure of three pixel areas of the display device according to an embodiment; FIG. 4 is a cross-sectional view taken along the lines X1-X1', X3-X3', and X5-X5' in FIG. 3; and FIG. 5 is a cross-sectional view taken along the line X7-X7' in FIG. 3. In the following embodiments, although some components are substantially the same as the components mentioned in FIGS. 1 and 2, new reference numerals will be given to facilitate the description of the arrangement and combination relationships among the components.

Referring to FIGS. 3 to 5, as described above with reference to FIG. 2, a first switching transistor T1a, a first driving transistor T2a, and a first storage capacitor Csta are disposed in a first pixel area PAa. Further, a second switching transistor T1b, a second driving transistor T2b, and a second storage capacitor Cstb are disposed in a second pixel area PAb. Further, a third switching transistor T1c, a third driving transistor T2c, and a third storage capacitor Cstc are disposed in a third pixel area PAc.

Herein, a laminate structure of the display device 10 will be described.

A substrate 100 may be made of an insulating material, such as glass, quartz, or a polymer resin. Examples of the polymer resin may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations thereof. The substrate 100 may also include a metal material.

The substrate 100 may be a rigid substrate, or may be a flexible substrate that can be bent, folded, and/or rolled. An example of a material constituting the flexible substrate is polyimide (PI), but the present invention is not limited thereto.

The first pixel area PAa, the second pixel area PAb, and the third pixel area PAc may be defined in the substrate 100. In some embodiments, the first pixel area PAa, the second pixel area PAb, and the third pixel area PAc may be sequentially located along the first direction DR1.

A first semiconductor pattern 151a of the first switching transistor T1a and a second semiconductor pattern 153a of the first driving transistor T2a are located in the first pixel area PAa on the substrate 100. In an embodiment, the first semiconductor pattern 151a and the second semiconductor pattern 153a may include polycrystalline silicon. The polycrystalline silicon may be formed by crystallizing amorphous silicon. Examples of the method of crystallizing amorphous silicon may include, but are not limited to, rapid thermal annealing (RTA), solid phase crystallization (SPC), excimer laser annealing (ELA), metal induced crystallization (MIC), metal induced lateral crystallization (MILC), and sequential lateral solidification (SLS). In another embodiment, the first semiconductor pattern 151a and the second semiconductor pattern 153a may include monocrystalline silicon, low-temperature polycrystalline silicon, or amorphous silicon. However, the present invention is not limited thereto, and, in another embodiment, the first semiconductor pattern 151a and the second semiconductor pattern 153a may include an oxide semiconductor. For example, the first semiconductor pattern 151a and the second semiconductor pattern 153a may include a two component-based compound (ABx), a three component-based compound (ABxCy), or a four component-based compound (ABxCyDz), which contains indium (In), zinc (Zn), gallium (Ga), tin (Sn), titanium (Ti), aluminum (Al), hafnium (Hf), zirconium (Zr), or magnesium (Mg).

Both sides of the first semiconductor pattern 151a and the second semiconductor pattern 153a may be doped with impurity ions (p-type impurity ions in the case of a PMOS transistor). In some embodiments, a trivalent dopant, such as boron (B), may be used as p-type impurity ions.

A third semiconductor pattern 151b of the second switching transistor T1b and a fourth semiconductor pattern 153b of the second driving transistor T2b are located in the second pixel area PAb on the substrate 100. Further, a fifth semiconductor pattern 151c of the third switching transistor T1c and a sixth semiconductor pattern 153c of the third driving transistor T2c are located in the third pixel area PAc on the substrate 100. The third semiconductor pattern 151b, the fourth semiconductor pattern 153b, the fifth semiconductor pattern 151c, and the sixth semiconductor pattern 153c may be made of a same material as the first semiconductor pattern 151a and the second semiconductor pattern 153a, or may include at least one selected from the described exemplified materials of the first semiconductor pattern 151a and the second semiconductor pattern 153a.

A first insulating layer 131 may be disposed on the first semiconductor pattern 151a, the second semiconductor pattern 153a, the third semiconductor pattern 151b, the fourth semiconductor pattern 153b, the fifth semiconductor pattern 151c, and the sixth semiconductor pattern 153c. In an embodiment, the first insulating layer 131 may be disposed generally over the entire surface of the substrate 100. The first insulating layer 131 may be a gate insulating film having a gate insulating function.

The first insulating layer 131 may include an inorganic insulating material, such as a silicon compound or a metal oxide. For example, the first insulating layer 131 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 131 may be a single film or a multilayer film formed of a laminated film of different materials.

A first conductive layer may be disposed on the first insulating layer 131. In an embodiment, the first conductive layer may include a gate line 121a, a first gate electrode 124a, a second gate electrode 127a, a third gate electrode 124b, a fourth gate electrode 127b, a fifth gate electrode 124c, a sixth gate electrode 127c, a first electrode CE1a of the first storage capacitor Csta, a first electrode CE1b of the second storage capacitor Cstb, and a first electrode CE1c of the third storage capacitor Cstc.

In an embodiment, the gate line 121a may extend along the first direction DR1.

The first gate electrode 124a, the third gate electrode 124b, and the fifth gate electrode 124c may be connected to the gate line 121a. The first gate electrode 124a may overlap the first semiconductor pattern 151a, the third gate electrode 124b may overlap the third semiconductor pattern 151b, and the fifth gate electrode 124c may overlap the fifth semiconductor pattern 151c.

The second gate electrode 127a may be spaced from the first gate electrode 124a, may be connected with the first electrode CE1a of the first storage capacitor Csta, and may overlap the second semiconductor pattern 153a. Similarly, the fourth gate electrode 127b may be spaced from the third gate electrode 124b, may be connected with the first electrode CE1b of the second storage capacitor Cstb, and may overlap the fourth semiconductor pattern 153b. Further, the sixth gate electrode 127c may be spaced from the fifth gate electrode 124c, may be connected with the first electrode CE1c of the third storage capacitor Cstc, and may overlap the sixth semiconductor pattern 153c.

In an embodiment, the first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu).

A second insulating layer 133 may be disposed on the first conductive layer. In an embodiment, the second insulating layer 133 may be generally disposed over the entire surface of the substrate 100. The second insulating layer 133 may be an interlayer insulating film.

The second insulating layer 133 may include an inorganic insulating material, such as silicon oxide, silicon nitride, silicon oxynitride, hafnium oxide, aluminum oxide, titanium oxide, tantalum oxide, or zinc oxide, or may include an organic insulating material, such as polyacrylate resin, epoxy resin, phenolic resin, polyamide resin, polyimide resin, unsaturated polyester resin, polyphenylene resin, polyphenylene sulfide resin, or benzocyclobutene (BCB). The second insulating layer 133 may be a single film or a multilayer film formed of a laminated film of different materials.

In the first pixel area PAa, a first contact hole H1a and a second contact hole H2a exposing a part of the second semiconductor pattern 153a and a fourth contact hole H4a and a fifth contact hole H5a exposing a part of the first semiconductor pattern 151a may be formed in the first insulating layer 131 and the second insulating layer 133. Further, a sixth contact hole H6a exposing the first electrode CE1a of the first storage capacitor Csta may be formed in the second insulating layer 133.

Similarly, in the second pixel area PAb, a first contact hole H1b and a second contact hole H2b exposing a part of the fourth semiconductor pattern 153b and a fourth contact hole H4b and a fifth contact hole H5b exposing a part of the third semiconductor pattern 151b may be formed in the first insulating layer 131 and the second insulating layer 133, and a sixth contact hole H6b exposing the first electrode CE1b of the second storage capacitor Cstb may be formed in the second insulating layer 133. Further, in the third pixel area PAc, a first contact hole H1c and a second contact hole H2c exposing a part of the sixth semiconductor pattern 153c and a fourth contact hole H4c and a fifth contact hole H5c exposing a part of the fifth semiconductor pattern 151c may be formed in the first insulating layer 131 and the second insulating layer 133, and a sixth contact hole H6c exposing the first electrode CE1c of the third storage capacitor Cstc may be formed in the second insulating layer 133.

A second conductive layer may be disposed on the second insulating layer 133. In an embodiment, the second conductive layer may include a first data line 171a, a second data line 171b, a third data line 171c, a first driving voltage line 181a, a second driving voltage line 181b, a third driving voltage line 181c, source electrodes 173a, 177a, 173b, 177b, 173c, and 177c, drain electrodes 175a, 179a, 175b, 179b, 175c, and 179c, a second electrode CE2a of the first storage capacitor Csta, a second electrode CE2b of the second storage capacitor Cstb, and a second electrode CE2c of the third storage capacitor Cstc.

In an embodiment, the first data line 171a, the second data line 171b, the third data line 171c, the first driving voltage line 181a, the second driving voltage line 181b, and the third driving voltage line 181c may extend in the second direction DR2 which is a column direction, and may be spaced apart from each other along the first direction DR1. In some embodiments, the first data line 171a, the first driving voltage line 181a, the second data line 171b, the second driving voltage line 181b, the third data line 171c, and the third driving voltage line 181c may be sequentially arranged along the direction DR1.

The second electrode CE2a of the first storage capacitor Csta may be connected to the first driving voltage line 181a, and may overlap the first electrode CE1a of the first storage capacitor Csta. Similarly, the second electrode CE2b of the second storage capacitor Cstb may be connected to the second driving voltage line 181b, and may overlap the first electrode CE1b of the second storage capacitor Cstb. Further, the second electrode CE2c of the third storage capacitor Cstc may be connected to the third driving voltage line 181c, and may overlap the first electrode CE1c of the third storage capacitor Cstc.

A first source electrode 173a may extend from the first data line 171a, and may be connected to the first semiconductor pattern 151a through the fourth contact hole H4a of the first pixel area PAa. Similarly, a third source electrode 173b may extend from the second data line 171b, and may be connected to the third semiconductor pattern 151b through the fourth contact hole H4b of the second pixel area PAb. Further, a fifth source electrode 173c may extend from the third data line 171c, and may be connected to the fifth semiconductor pattern 151c through the fourth contact hole H4c of the third pixel area PAc.

A second source electrode 177a may extend from the first driving voltage line 181a, and may be connected to the second semiconductor pattern 153a through the first contact hole H1a of the first pixel area PAa. Similarly, a fourth source electrode. 177b may extend from the second driving voltage line 181b, and may be connected to the fourth semiconductor pattern 153b through the first contact hole H1b of the second pixel area PAb. Further, a sixth source electrode 177c may extend from the third driving voltage line 181c, and may be connected to the sixth semiconductor pattern 153c through the first contact hole H1c of the third pixel area PAc.

A first drain electrode 175a may be spaced apart from the first source electrode 173a, may be connected to the first semiconductor pattern 151a through the fifth contact hole H5a of the first pixel area PAa, and may be connected to the first electrode CE1a of the first storage capacitor Csta through the sixth contact hole H6a of the first pixel area PAa.

Similarly, a third drain electrode 175*b* may be spaced apart from the third source electrode 173*b*, may be connected to the third semiconductor pattern 151*b* through the fifth contact hole H5*b* of the second pixel area PAb, and may be connected to the first electrode CE1*b* of the second storage capacitor Cstb through the sixth contact hole H6*b* of the second pixel area PAb. Further, a fifth drain electrode 175*c* may be spaced apart from the fifth source electrode 173*c*, may be connected to the fifth semiconductor pattern 151*c* through the fifth contact hole H5*c* of the third pixel area PAc, and may be connected to the first electrode CE1*c* of the third storage capacitor Cstc through the sixth contact hole H6*c* of the third pixel area PAc.

A second drain electrode 179*a* may be spaced apart from the second source electrode 177*a*, and may be connected to the second semiconductor pattern 153*a* through the second contact hole H2*a* of the first pixel area PAa. Similarly, a fourth drain electrode 179*b* may be spaced apart from the fourth source electrode 177*b*, and may be connected to the fourth semiconductor pattern 153*b* through the second contact hole H2*b* of the second pixel area PAb. Further, a sixth drain electrode 179*c* may be spaced apart from the sixth source electrode 177*c*, and may be connected to the sixth semiconductor pattern 153*c* through the second contact hole H2*c* of the third pixel area PAc.

In an embodiment, the second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer may be a single layer film or a multilayer film. For example, the second conductive layer may have a laminate structure of Ti/Al/Ti, Mo/Al/Mo, Mo/AlGe/Mo, or Ti/Cu.

A third insulating layer 135 may be disposed on the second conductive layer. In an embodiment, the third insulating layer 135 may be generally disposed over the entire surface of the substrate 100. The third insulating layer 135 may be an interlayer insulating film. In an embodiment, the third insulating layer 135 may be made of a same material as the second insulating material 133, or may include at least one selected from the described exemplified materials of the second insulating material 133.

In the first pixel area PAa, a third contact hole H3*a* exposing a part of the second drain electrode 179*a* may be formed in the third insulating layer 135. In the second pixel area PAb, a third contact hole H3*b* exposing a part of the fourth drain electrode 179*b* may be formed in the third insulating layer 135. In the third pixel area PAc, a third contact hole H3*c* exposing a part of the sixth drain electrode 179*c* may be formed in the third insulating layer 135.

A pixel defining film 141 for partitioning a light emitting area may be disposed on the third insulating layer 135. In an embodiment, the pixel defining film 141 may include an organic material, such as polyimide, or may include hexamethyldisiloxane (HMDSO).

In the first pixel area PAa, a first opening OPa may be formed in the pixel defining film 141, and the pixel defining film 141 may include a first side surface 1411*a* defining the first opening OPa. Similarly, in the second pixel area PAb, a second opening OPb may be formed in the pixel defining film 141, and the pixel defining film 141 may include a second side surface 1411*b* defining the second opening OPb. Further, in the third pixel area PAc, a third opening OPc may be formed in the pixel defining film 141, and the pixel defining film 141 may include a third side surface 1411*c* defining the third opening OPc.

A third conductive layer may be disposed on the pixel defining film 141 and the third insulating layer 135. In an embodiment, the third conductive layer includes a first lower electrode 210*a*, a second lower electrode 210*b*, a third lower electrode 210*c*, a first reflective pattern 270*a*, and a second reflective pattern 270*b*. In some embodiments, the third conductive layer may further include a third reflective pattern 270*c*.

In an embodiment, the first lower electrode 210*a* may be an anode electrode of a first organic light emitting element ELa. The first lower electrode 210*a* is located in the first pixel area PAa. The first lower electrode 210*a* may be connected to the second drain electrode 179*a* through the third contact hole H3*a* of the first pixel area PAa. In an embodiment, the first lower electrode 210*a* may be located on the first side surface 1411*a* of the pixel defining film 141, which is an inclined surface around the first opening OPa, and a part of the first lower electrode 210*a* may be located on an upper surface 1413 of the pixel defining film 141. In some embodiments, the first lower electrode 210*a* may contact the first side surface 1411*a* of the pixel defining film 141, and may also contact the upper surface 1413 of the pixel defining film 141.

The first reflective pattern 270*a* may be located in the first opening OPa, and may be located on the third insulating layer 135. The first reflective pattern 270*a* may reflect incident light upwards. The first reflective pattern 270*a* is physically and electrically spaced apart from the first lower electrode 210*a*. In some embodiments, the first reflective pattern 270*a* may not overlap the pixel defining film 141. The first reflective pattern 270*a* may be a floating pattern to which an electrical signal is not transmitted. The first reflective pattern 270*a* may include a metal having excellent reflectivity, as described later.

In some embodiments, the first reflective pattern 270*a* may be surrounded by the first lower electrode 270*a* when viewed from a plan view. In an embodiment, the first lower electrode 210*a* may have a closed loop shape surrounding the first reflective pattern 270*a*. However, the present invention is not limited thereto, and the arrangement of the first lower electrode 210*a* and the first reflective pattern 270*a* may be variously changed.

In an embodiment, the second lower electrode 210*b* may be an anode electrode of a second organic light emitting element ELb. The second lower electrode 210*b* may be located in the second pixel area PAb, and may be connected to the fourth drain electrode 179*b* through the third contact hole H3*b* of the second pixel area PAb. In an embodiment, the second lower electrode 210*b* may be located on the second side surface 1411*b* of the pixel defining film 141, which is an inclined surface around the second opening OPb, and a part of the second lower electrode 210*b* may be located on the upper surface 1413 of the pixel defining film 141.

The second reflective pattern 270*b* may be located in the second opening OPb, and may be located on the third insulating layer 135. The second reflective pattern 270*b* is physically and electrically spaced apart from the second lower electrode 210*b*.

In an embodiment, the third lower electrode 210*c* may be an anode electrode of a third organic light emitting element ELc. The third lower electrode 210*c* may be located in the third pixel area PAc, and may be connected to the sixth drain electrode 179*c* through the third contact hole H3*c* of the third pixel area PAc.

In some embodiments, similarly to the first lower electrode 210*a* and the second lower electrode 210*b*, the third lower electrode 210*c* may be located on the third side surface 1411c of the pixel defining film 141, which is an inclined surface around the third opening OPc, and a part of the third lower electrode 210c may be located on the upper surface 1413 of the pixel defining film 141.

The third reflective pattern 270c may be located in the third opening OPc, and may be located on the third insulating layer 135. In an embodiment, the third reflective pattern 270c is physically and electrically spaced apart from the third lower electrode 210c. However, the present invention is not limited thereto. In an embodiment, unlike the first reflective pattern 270a and the second reflective pattern 270b, the third reflective pattern 270c may also be physically and electrically connected to the third lower electrode 210c. Herein, for convenience of explanation, a case in which the third reflective pattern 270c is spaced apart from the third lower electrode 210c will be described.

In an embodiment, the first lower electrode 210a, the second lower electrode 210b, the third lower electrode 210c, the first reflective pattern 270a, the second reflective pattern 270b, and the third reflective pattern 270c may be formed concurrently (e.g., simultaneously) in a same process. For example, the first lower electrode 210a, the second lower electrode 210b, the third lower electrode 210c, the first reflective pattern 270a, the second reflective pattern 270b, and the third reflective pattern 270c may be formed concurrently (e.g., simultaneously) by forming one conductive layer and then patterning the conductive layer.

In an embodiment, the third conductive layer may include a reflective metal. For example, the third conductive layer may include silver (Ag), magnesium (Mg), aluminum (Al), platinum (Pt), lead (Pb), gold (Au), nickel (Ni), iridium (Ir), chromium (Cr), lithium (Li), calcium (Ca), or a mixture thereof. In some embodiments, the third conductive layer may have a multilayer structure made of a transparent conductive material such as indium-tin-oxide (ITO), indium-zinc-oxide (IZO), zinc oxide (ZnO), or indium oxide ($In_2O_3$), and the aforementioned reflective metal. For example, the third conductive layer may have a multilayer structure of ITO/Mg, ITO/MgF, ITO/Ag, ITO/Ag/ITO, or Ag/ITO/Ag, but the present invention is not limited thereto.

A bank pattern 143 may be disposed on the pixel defining film 141. In an embodiment, the bank pattern 143 may cover a portion overlapping the upper surface 1413 of the pixel defining film 141 among the first lower electrode 210a, the second lower electrode 210b, and the third lower electrode 210c, and may not cover a portion located on the first side surface 1411a corresponding to the first lower electrode 210a, a portion located on the second side surface 1411b corresponding to the second lower electrode 210b, and a portion located on the third side surface 1411c corresponding to the third lower electrode 210c. In an embodiment, the bank pattern 143 may be made of an organic material.

A light emitting layer 230 may be disposed on the third conductive layer. The light emitting layer 230 may cover the first lower electrode 210a, the second lower electrode 210b, the third lower electrode 210c, the first reflective pattern 270a, the second reflective pattern 270b, and the third reflective pattern 270c. Further, the light emitting layer 230 may cover the bank pattern 143.

The light emitting layer 230 may be disposed over the first pixel area PAa, the second pixel area PAb, and the third pixel area PAc. In an embodiment, in the light emitting layer 230, a portion located in the first pixel area PAa, a portion located in the second pixel area PAb, and a portion located in the third pixel area PAc may be made of a same material, and may be connected to each other in some embodiments.

The light emitting layer 230 may emit first light L, and the first light L may be blue light. For example, the first light L may have a spectrum having maximum intensity at 450 nm to 460 nm. That is, in an embodiment, the light emitting layer 230 may be a blue light emitting layer.

An upper electrode 250 may be disposed on the light emitting layer 230. The upper electrode 250 may be disposed over the first pixel area PAa, the second pixel area PAb, and the third pixel area PAc. In an embodiment, the upper electrode 250 may be a cathode electrode of each of the first organic light emitting element ELa, the second organic light emitting element ELb, and the third organic light emitting element ELc. In an embodiment, the upper electrode 250 may include a transparent conductive material, such as ITO, IZO, ZnO, or $In_2O_3$.

The first lower electrode 210a, the light emitting layer 230, and the upper electrode 250 constitute the first organic light emitting element ELa. The second lower electrode 210b, the light emitting layer 230, and the upper electrode 250 constitute the second organic light emitting element ELb. The third lower electrode 210c, the light emitting layer 230, and the upper electrode 250 constitute the third organic light emitting element ELc.

In an embodiment, a first wavelength conversion layer 510 and a second wavelength conversion layer 530 may be disposed on the upper electrode 250, and a light transmitting layer 550 may be further disposed on the upper electrode 250.

The first wavelength conversion layer 510 may be located in the first pixel area PAa, and may be located in the first opening OPa.

In an embodiment, the first wavelength conversion layer 510 may include a first medium layer 511 made of a transparent organic material or the like and a first quantum dot 513 dispersed in the first medium layer 511. Quantum dots convert the wavelength of light to emit a desired specific light, and wavelengths that can be converted vary depending on the size of particles. Therefore, when the size of the quantum dots is adjusted, light of a desired color can be emitted.

In an embodiment, the first quantum dot 513 may include any selected from CdSe, ZnSe, ZnO, ZnTe, InP, GaP, InGaN, and InN. In an embodiment, a diameter of the first quantum dot may be adjusted within a range of 2 nm to 10 nm. However, the material and diameter of the first quantum dot 513 according to the present invention are not limited thereto.

The first quantum dot 513 may convert the wavelength of the first light L emitted from the light emitting layer 230 to convert the first light L into second light La. In some embodiments, the second light La may be red light. For example, the second light La may have a spectrum having maximum intensity at 630 nm to 640 nm. According to embodiments, since the first light L is converted into the second light La by using the first quantum dot 513, color purity and color reproducibility can be improved. Further, since light emitted through quantum dots is emitted in all directions, a light viewing angle can be improved.

In an embodiment, the first lower electrode 210a may be disposed on the first sidewall 1411a, and may be disposed to surround the first wavelength conversion layer 510. Since the light emitting layer 230 and the upper electrode 250 are disposed on the first lower electrode 210a, the first light L emitted from the light emitting layer 230 is incident on the side of the first wavelength conversion layer 510. Thus, the possibility that light not converted by the first wavelength conversion layer 510 in the first light L is emitted to the outside is lowered, so that light conversion efficiency and color purity can be improved.

The first reflective pattern 270a is disposed under the first wavelength conversion layer 510 in the first opening OPa. Thus, the component of the first light L emitted from the light emitting layer 230 toward the first reflective pattern 270a is reflected by the first reflective pattern 270a and provided to the first wavelength conversion layer 510. Further, the component of the second light La converted by the first wavelength conversion layer 510 toward the first reflective pattern 270a is reflected by the first reflective pattern 270a and provided to the outside through the first wavelength conversion layer 510. Thus, light efficiency is improved.

The second wavelength conversion layer 530 may be located in the second pixel area PAb, and may be located in the second opening OPb.

In an embodiment, the second wavelength conversion layer 530 may include a second medium layer 531 made of a transparent organic material or the like and a second quantum dot 533 dispersed in the second medium layer 531. The second quantum dot 533 may convert the wavelength of the first light L emitted from the light emitting layer 230 to convert the first light L into third light Lb.

When the size of the quantum dot decreases, the wavelength of emitted light increases to generate blue light. When the size of the quantum dot increases, the wavelength of emitted light decreases to generate red light. In some embodiments, the size of the second quantum dot 533 may be smaller than the size of the first quantum dot 513. Accordingly, the third light Lb emitted from the second wavelength conversion layer 530 may have a different color from the second light La emitted from the first wavelength conversion layer 510. In some embodiments, the third light Lb may be green light. For example, the third light may have a spectrum having a maximum intensity at 520 nm to 560 nm. According to embodiments, since the first light L is converted into the third light Lb by using the second quantum dot 533, color purity and color reproducibility can be improved, and a light viewing angle can be improved.

In an embodiment, in the second pixel area PAb, the second lower electrode 210b may be located on the second sidewall 1411b, and may be disposed to surround the second wavelength conversion layer 530. Thus, light conversion efficiency is improved. Further, the second reflective pattern 270b is located under the second wavelength conversion layer 530, and thus light efficiency is improved.

In an embodiment, a separate wavelength conversion layer may not be disposed in the third pixel area PAc. Therefore, in the third pixel area PAc, the first light L may be directly emitted to the outside of the display device. That is, in the third pixel area PAc, the first light L having a spectrum having maximum intensity at 450 nm to 460 nm may be emitted.

In some embodiments, a light transmitting layer 550 may be disposed in the third opening OPc. In an embodiment, the light transmitting layer 550 may include a third medium layer 551 made of a transparent organic material, and the first light L emitted from the light emitting layer 230 may be transmitted in the light transmitting layer 550.

In an embodiment, the light transmitting layer 550 may further include a scattering material 553. The scattering material 553 can make the front luminance and side luminance of the light emitted from the light transmitting layer 550 uniform. The scattering material 553 may be made of any material for uniformly scattering light. For example, the scattering material 553 may be any one of silica, $TiO_2$, $ZrO_2$, $Al_2O_3$, $In_2O_3$, $ZnO$, $SnO_2$, and $Sb_2O_3$. Since the light transmitting layer 550 includes the scattering material 553, there is an advantage of improving a light viewing angle.

In the aforementioned display device 10, although the first organic light emitting element ELa, the second organic light emitting element ELb, and the third organic light emitting element ELc share the light emitting layer 230, all of the first light L (for example, blue light), the second light La (for example, red light), and the third light Lb (for example, green light) may be emitted for each pixel area.

A thin film encapsulation layer TFE may be disposed on the upper electrode 250, the first wavelength conversion layer 510, the second wavelength conversion layer 530, and the light transmitting layer 550.

The thin film encapsulation layer TFE may encapsulate the first organic light emitting element ELa, the second organic light emitting element ELb, and the third organic light emitting element ELc to prevent or substantially prevent moisture or the like from flowing into the first organic light emitting element ELa, the second organic light emitting element Elb, and the third organic light emitting element ELc. Further, the thin film encapsulation layer TFE may encapsulate the first wavelength conversion layer 510, the second wavelength conversion layer 530, and the light transmitting layer 550 to block the inflow of moisture from the outside.

In some embodiments, the thin film encapsulation layer TFE may include one or more organic layers and one or more inorganic layers. In an embodiment, the thin film encapsulation layer TFE may include a first inorganic layer 310, an organic layer 330, and a second inorganic layer 350.

The first inorganic layer 310 can prevent or substantially prevent moisture, oxygen or the like from penetrating the first organic light emitting element ELa, the second organic light emitting element ELb, the third organic light emitting element ELc, the first wavelength conversion layer 510, the second wavelength conversion layer 530, and the light transmitting layer 550. In some embodiments, the first inorganic layer 310 may include an inorganic material, and the inorganic material may be at least one selected from silicon oxide (SiOx), silicon nitride (SiNx), and silicon oxynitride (SiONx).

The organic layer 330 may be disposed on the first inorganic layer 310, and can improve the flatness. The organic layer 330 may include an organic material, and, in an embodiment, the organic material may be at least one selected from epoxy, acrylate, and urethane acrylate.

The second inorganic layer 350 may be disposed on the organic layer 330. The second inorganic layer 350 may have substantially a same or similar role to the first inorganic layer 310, and may be made of a material substantially the same as or similar to the first inorganic layer 310. In some embodiments, the second inorganic layer 350 may completely cover the organic layer 330. In some embodiments, the second inorganic layer 350 and the first inorganic layer 310 may be in contact with each other in the non-display area NDA to form an inorganic-inorganic junction. When the inorganic-inorganic junction is formed, it is possible to effectively prevent moisture and the like from entering the display device 10 from the outside of the display device 10.

Figure 6:
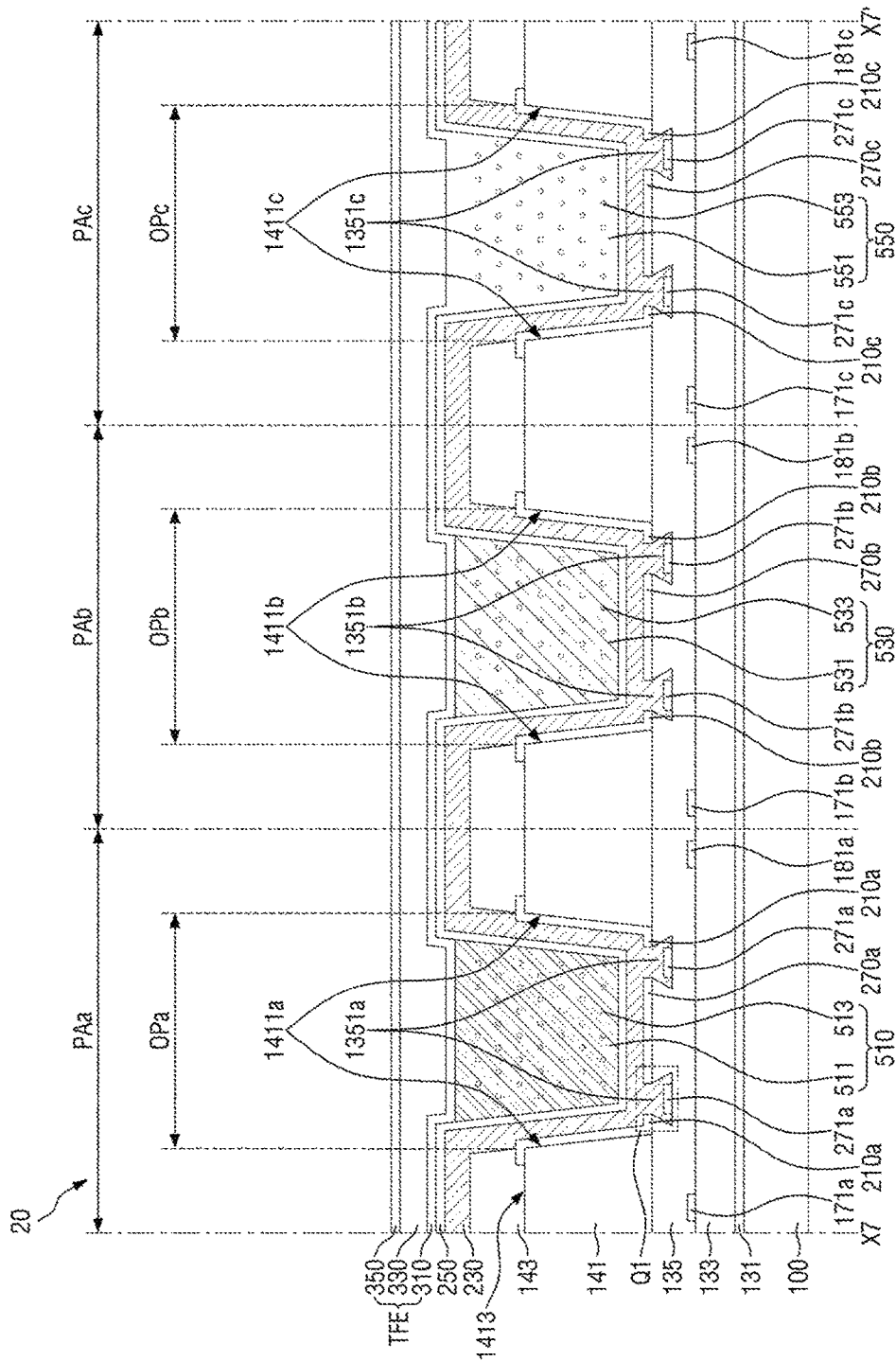
FIG. 6 is a cross-sectional view of a display device according to another embodiment, taken along a line corresponding to the line X7-X7' in FIG. 3.
Figure 7:
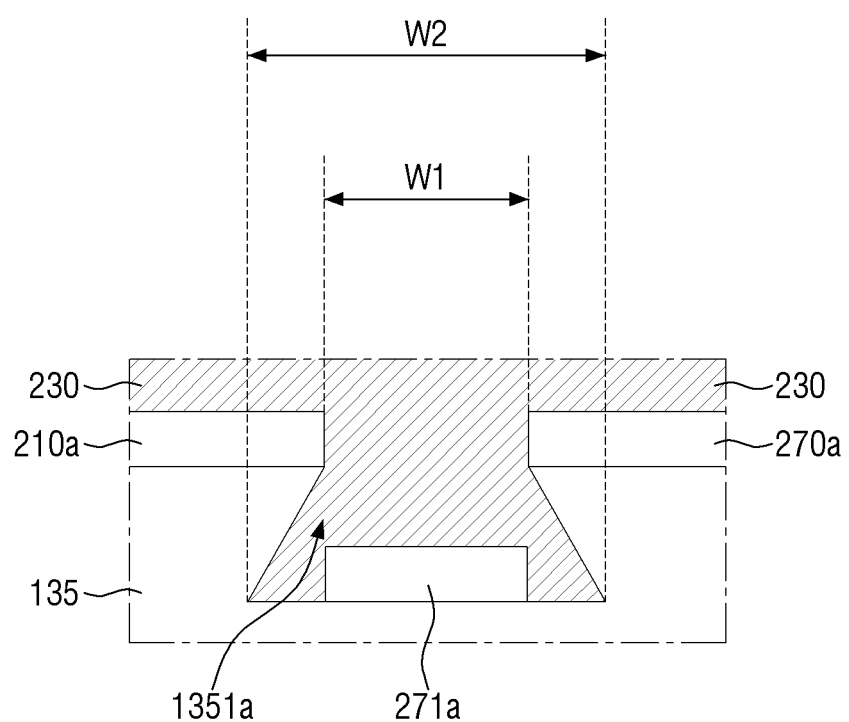
FIG. 7 is an enlarged view of a region "Q1" in FIG. 6.

FIG. 6 is a cross-sectional view of a display device according to another embodiment, taken along a line corresponding to the line X7-X7' in FIG. 3; and FIG. 7 is an enlarged view of a region "Q1" in FIG. 6.

Referring to FIGS. 6 and 7, a display device 20 according to another embodiment is different from the display device 10 described above with reference to FIGS. 3 to 5 in that a first groove 1351a, a second groove 1351b, and a third groove 1351c are formed in the third insulating layer 135, and other configurations of the display device 20 are substantially the same as or similar to those of the display device 10 described above. Therefore, herein, differences will be mainly described.

The first groove 1351a of the third insulating layer 135 is located in the first pixel area PAa, and is formed between the first lower electrode 210a and the first reflective pattern 270a. A width W1 of an uppermost portion of the first groove 1351a may be smaller than a width W2 of a lowermost portion thereof. In an embodiment, the width of the first groove 1351a may increase from the uppermost portion to the lowermost portion.

As the first groove 1351a is formed in the third insulating layer 135, when the conductive layer is deposited to form the first lower electrode 210a and the first reflective pattern 270a in a manufacturing process, the first lower electrode 210a and the first reflective pattern 270a may be separated from each other although a patterning process is not performed.

In some embodiments, a first conductive pattern 271a may be located in the first groove 1351a. The first conductive pattern 271a may be a residual pattern remaining in the manufacturing process of the first lower electrode 210a and the first reflective pattern 270a, and may be spaced apart from the first lower electrode 210a and the first reflective pattern 270a. The first conductive pattern 271a may be made of a same material as the first lower electrode 210a and the first reflective pattern 270a.

Similarly to the first pixel area PAa, in the second pixel area PAb, the second groove 1351b of the third insulating layer 135 is formed between the second lower electrode 210b and the second reflective pattern 270b. In some embodiments, a second conductive pattern 271b may be located in the second groove 1351b. Further, in the third pixel area PAc, the third groove 1351c of the third insulating layer 135 is formed between the third lower electrode 210c and the third reflective pattern 270c, and a third conductive pattern 271c may be located in the third groove 1351c. In an embodiment, a description of the second groove 1351b and the third groove 1351c is substantially the same as that of the first groove 1351a and will therefore be omitted.

Figure 8:
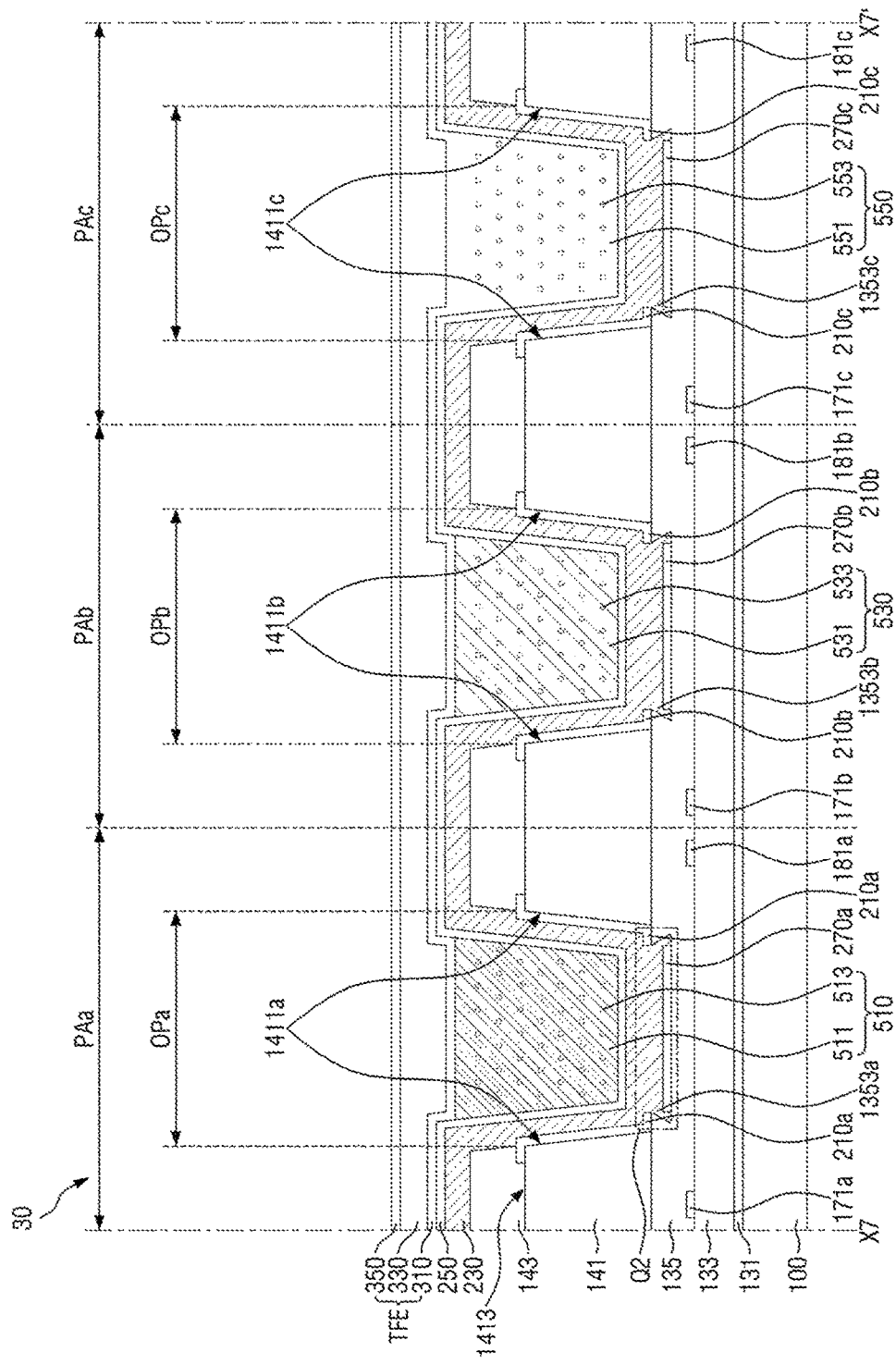
FIG. 8 is a cross-sectional view of a display device according to another embodiment, taken along a line corresponding to the line X7-X7' in FIG. 3.
Figure 9:
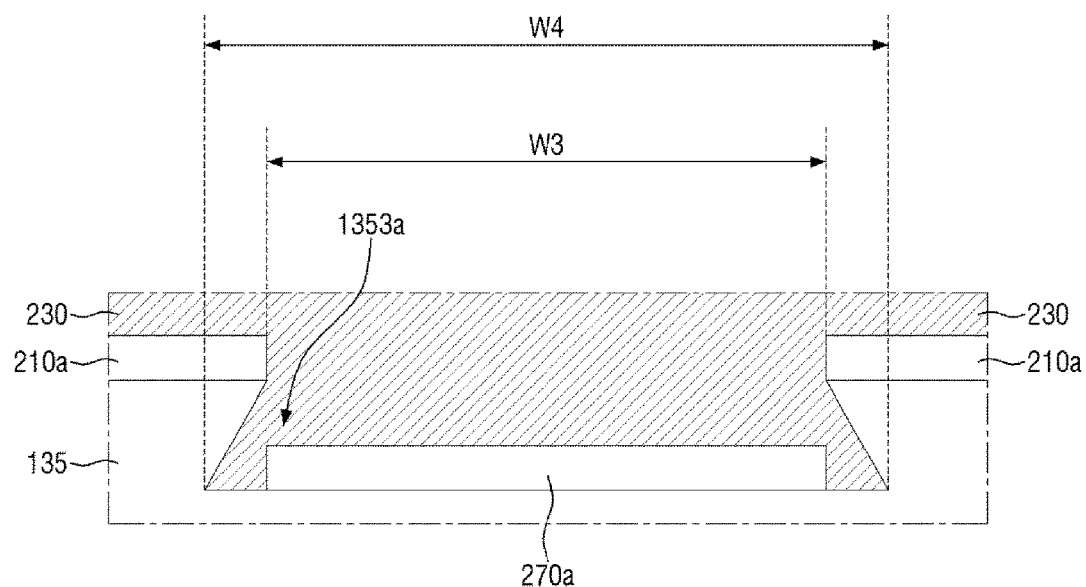
FIG. 9 is an enlarged view of a region "Q2" in FIG. 8.

FIG. 8 is a cross-sectional view of a display device according to another embodiment, taken along a line corresponding to the line X7-X7' in FIG. 3; and FIG. 9 is an enlarged view of a region "Q2" in FIG. 8.

Referring to FIGS. 8 and 9, a display device 30 according to another embodiment is different from the display device 10 described above with reference to FIGS. 3 to 5 in that a first groove 1353a, a second groove 1353b, and a third groove 1353c are formed in the third insulating layer 135, and other configurations of the display device 30 are substantially the same as or similar to those of the display device 10 described above. Therefore, herein, differences will be mainly described.

The first groove 1353a of the third insulating layer 135 is located in the first pixel area PAa. A width W3 of an uppermost portion of the first groove 1353a may be smaller than a width W4 of a lowermost portion thereof. In an embodiment, the width of the first groove 1353a may increase from the uppermost portion to the lowermost portion.

The first reflective pattern 270a is located in the first groove 1353a. As the first groove 1353a is formed in the third insulating layer 135, when the conductive layer is deposited to form the first lower electrode 210a and the first reflective pattern 270a in a manufacturing process, the first lower electrode 210a and the first reflective pattern 270a may be separated from each other although a patterning process is not performed.

Similarly to the first groove 1353a, the second groove 1353b of the third insulating layer 135 is located in the second pixel area PAb, and the second reflective pattern 270b is located in the second groove 1353b. Further, the third groove 1353c of the third insulating layer 135 is located in the third pixel area PAc, and the third reflective pattern 270c is located in the third groove 1353c. In an embodiment, a description of the second groove 1353b and the third groove 1353c is substantially the same as that of the first groove 1353a and will therefore be omitted.

Figure 10:
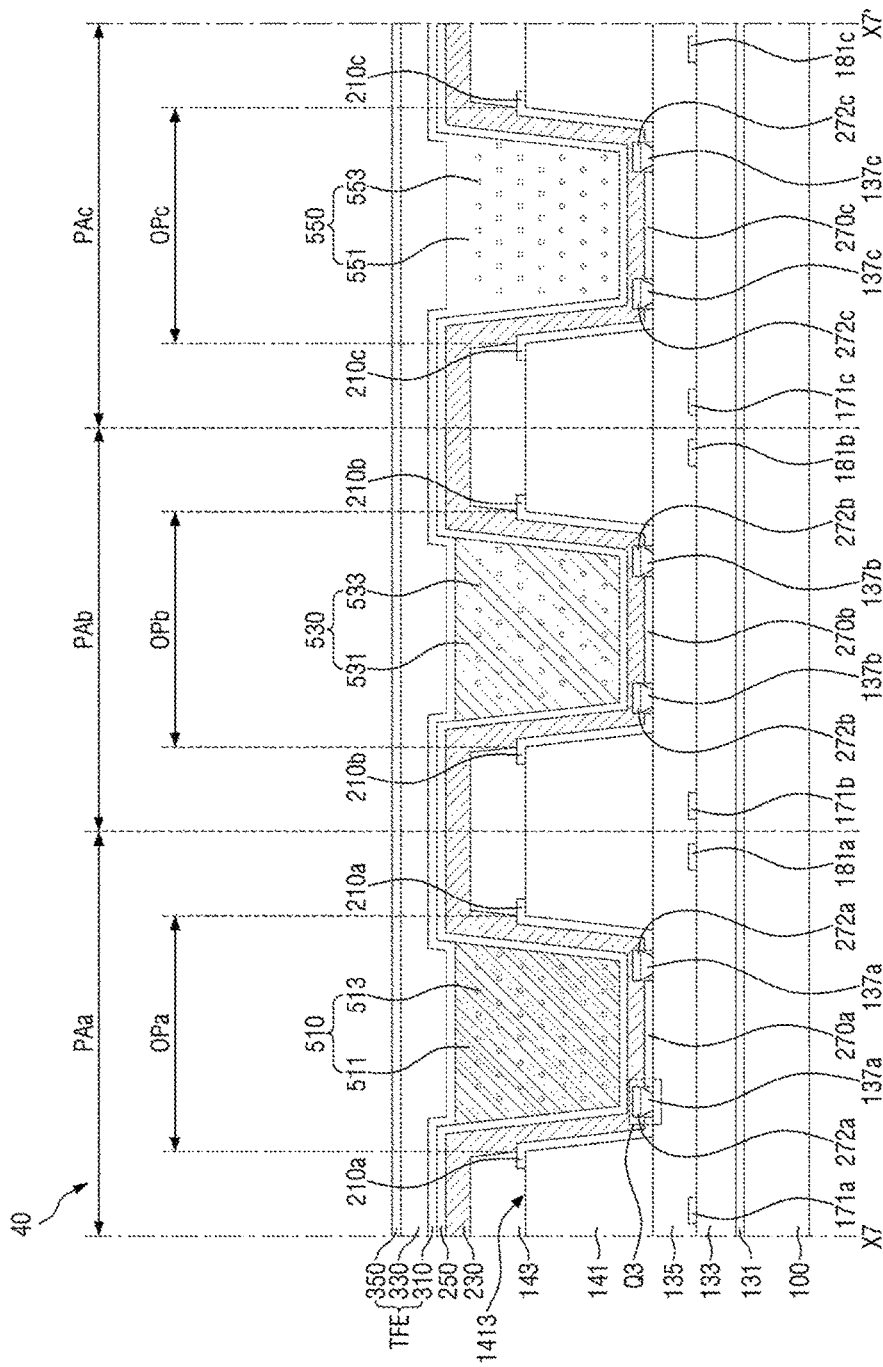
FIG. 10 is a cross-sectional view of a display device according to another embodiment, taken along a line corresponding to the line X7-X7' in FIG. 3.
Figure 11:
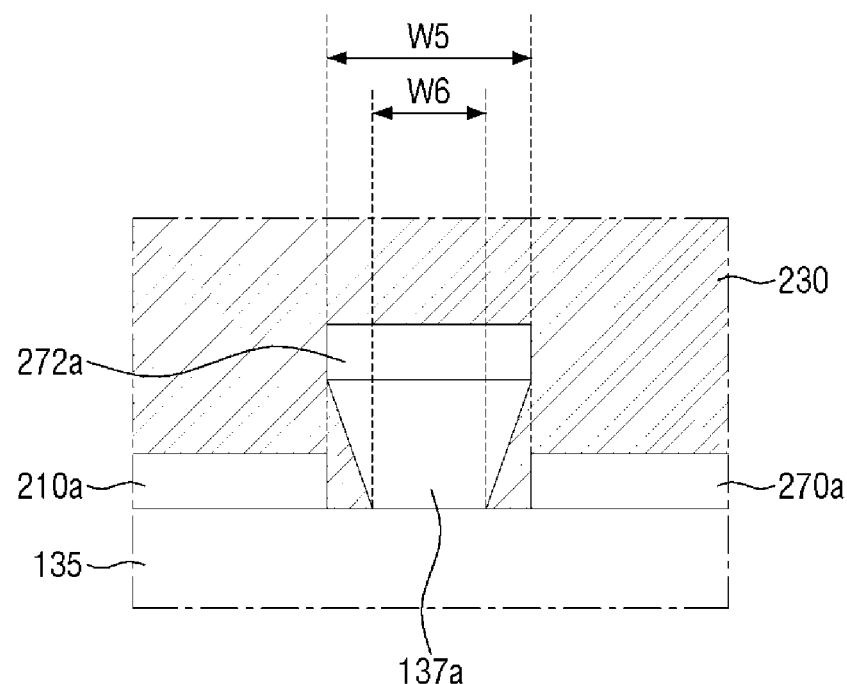
FIG. 11 is an enlarged view of a region "Q3" in FIG. 10.

FIG. 10 is a cross-sectional view of a display device according to another embodiment, taken along a line corresponding to the line X7-X7' in FIG. 3; and FIG. 11 is an enlarged view of a region "Q3" in FIG. 10.

Referring to FIGS. 10 and 11, a display device 40 according to another embodiment is different from the display device 10 described above with reference to FIGS. 3 to 5 in that a first insulation pattern 137a, a second insulation pattern 137b, and a third insulation pattern 137c are further disposed on the third insulating layer 135, and other configurations of the display device 40 are substantially the same as or similar to those of the display device 10 described above. Therefore, herein, differences will be mainly described.

The first insulation pattern 137a is disposed on the third insulating layer 135, and is formed between the first lower electrode 210a and the first reflective pattern 270a in the first pixel area PAa. The first insulation pattern 137a is made of an insulating material. In some embodiments, the insulating material may be an organic material.

The first insulation pattern 137a may have a cross-sectional shape taken along a width direction. In an embodiment, in the cross-sectional shape, an uppermost width W5 thereof may be larger than a lowermost width W6 thereof. In an embodiment, the width of the cross-sectional shape of the first insulation pattern 137a may decrease from the uppermost portion to the lowermost portion. For example, the cross-sectional shape of the first insulation pattern 137a may be a reversely tapered shape.

As the first insulation pattern 137a is located on the third insulating layer 135, when the conductive layer is deposited to form the first lower electrode 210a and the first reflective pattern 270a in a manufacturing process, the first lower electrode 210a and the first reflective pattern 270a may be separated from each other although a patterning process is not performed.

In some embodiments, a first conductive pattern 272a may be located on the first insulation pattern 137a. The first conductive pattern 272a may be a residual pattern remaining in the manufacturing process of the first lower electrode 210a and the first reflective pattern 270a, and may be spaced apart from the first lower electrode 210a and the first reflective pattern 270a. The first conductive pattern 272a may be made of a same material as the first lower electrode 210a and the first reflective pattern 270a.

Similarly to the first pixel area PAa, in the second pixel area PAb, the second insulation pattern 137b may be located on the third insulating layer 135. The second insulation pattern 137b may be located between the second lower electrode 210b and the second reflective pattern 270b. In some embodiments, a second conductive pattern 272b may be located on the second insulation pattern 137b. Further, in the third pixel area PAc, the third insulation pattern 137c may be located on the third insulating layer 135. The third insulation pattern 137c may be located between the third lower electrode 210c and the third reflective pattern 270c. In some embodiments, a third conductive pattern 272c may be located on the third insulation pattern 137c.

A description of the second insulation pattern 137b and the third insulation pattern 137c may be substantially the same as the description of the first insulation pattern 137a, and a description of the second conductive pattern 272b and the third conductive pattern 272c may be substantially the same as the description of the first conductive pattern 272a. Therefore, further descriptions thereof will be omitted.

Figure 12:
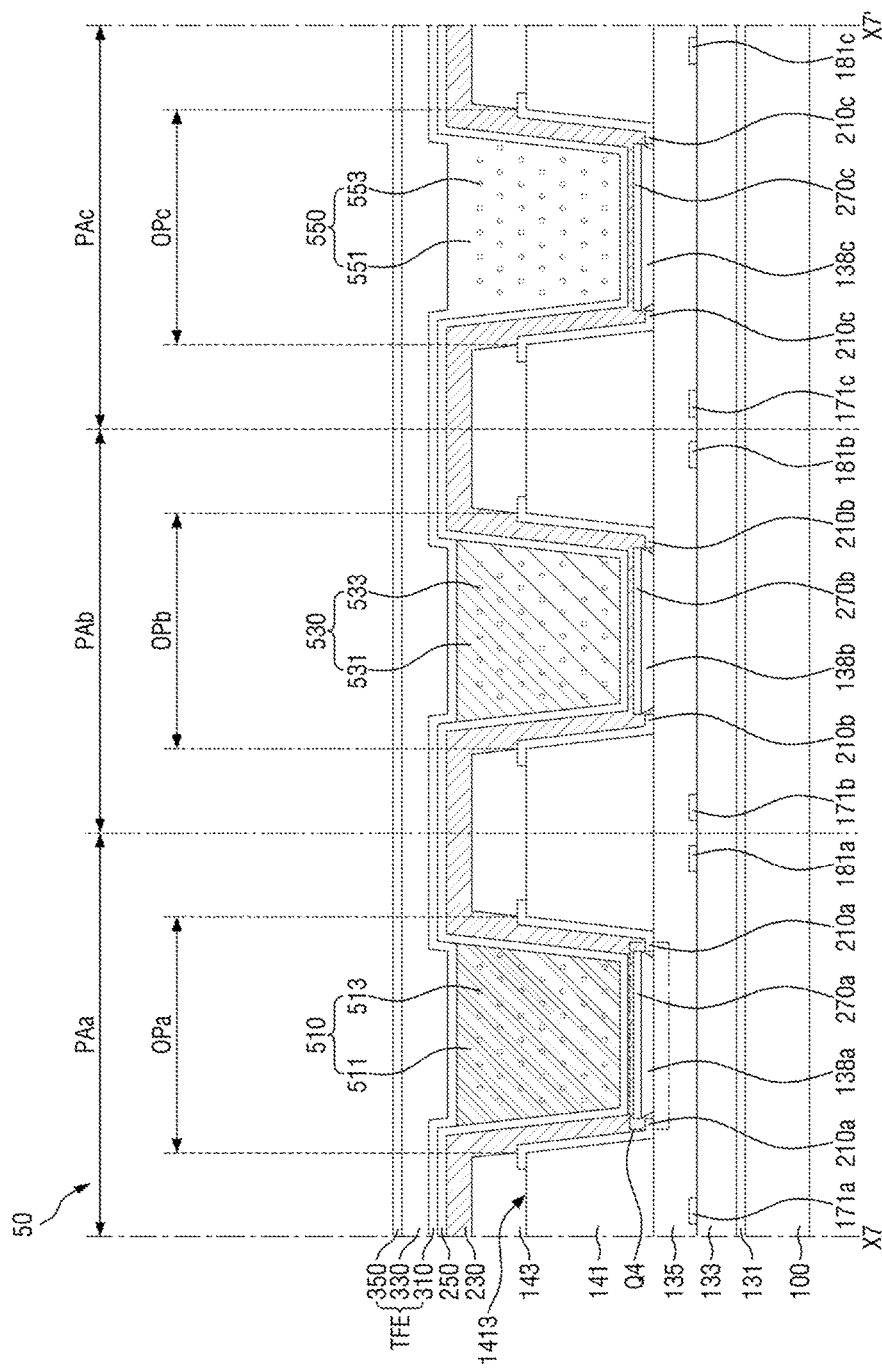
FIG. 12 is a cross-sectional view of a display device according to another embodiment, taken along a line corresponding to the line X7-X7' in FIG. 3.
Figure 13:
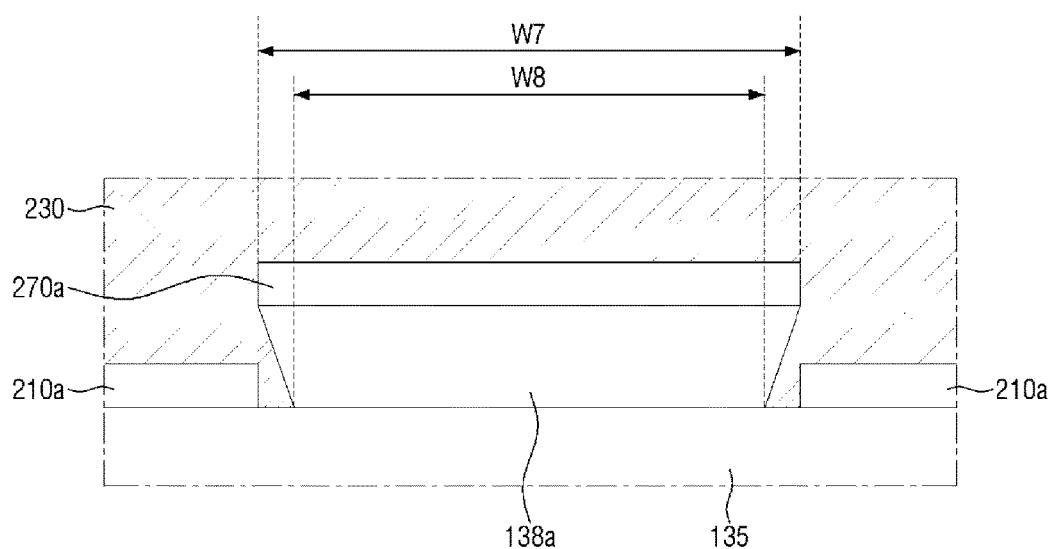
FIG. 13 is an enlarged view of a region "Q4" in FIG. 12.

FIG. 12 is a cross-sectional view of a display device according to another embodiment, taken along a line corresponding to the line X7-X7' in FIG. 3; and FIG. 13 is an enlarged view of a region "Q4" in FIG. 12.

Referring to FIGS. 12 and 13, a display device 50 according to another embodiment is different from the display device 10 described above with reference to FIGS. 3 to 5 in that a first insulation pattern 138a, a second insulation pattern 138b, and a third insulation pattern 138c are further disposed on the third insulating layer 135, and other configurations of the display device 50 are substantially the same as or similar to those of the display device 10 described above. Therefore, herein, differences will be mainly described.

The first insulation pattern 138a is disposed on the third insulating layer 135, and is formed under the first reflective pattern 270a in the first pixel area PAa. The first insulation pattern 138a is made of an insulating material. In some embodiments, the insulating material may be an organic material.

The first insulation pattern 138a may have a cross-sectional shape taken along a width direction. In an embodiment, in the cross-sectional shape, an uppermost width W7 thereof may be greater than a lowermost width W8 thereof. In an embodiment, the width of the cross-sectional shape of the first insulation pattern 138a may decrease from the uppermost portion to the lowermost portion. For example, the cross-sectional shape of the first insulation pattern 138a may be a reversely tapered shape.

In some embodiments, the width W7 of the uppermost portion of the first insulation pattern 138a, measured along one direction, may be substantially the same as the width of the first reflective pattern 270a, measured along one direction.

As the first insulation pattern 138a is located on the third insulating layer 135, when the conductive layer is deposited to form the first lower electrode 210a and the first reflective pattern 270a in a manufacturing process, the first lower electrode 210a and the first reflective pattern 270a may be separated from each other although a patterning process is not performed.

Similarly to the first pixel area PAa, in the second pixel area PAb, the second insulation pattern 138b may be disposed on the third insulating layer 135, and may be disposed under the second reflective pattern 270b. Further, in the third pixel area PAc, the third insulation pattern 138c may be disposed on the third insulating layer 135, and may be disposed under the third reflective pattern 270c.

In an embodiment, a description of the second insulation pattern 138b and the third insulation pattern 138c may be substantially the same as that of the first insulation pattern 138a, and, therefore, further description will be omitted.

As described above, according to embodiments of the present invention, there is provided a display device having improved light efficiency and color reproducibility.

The aspects and effects of the present invention are not limited by the foregoing, and other various aspects and effects are anticipated or will be apparent from the description provided herein.

Although some exemplary embodiments of the present invention have been disclosed for illustrative purposes, those skilled in the art will appreciate that various modifications, additions, and substitutions are possible, without departing from the scope and spirit of the invention as set forth in the accompanying claims.

What is claimed is:

1. A display device comprising:
a substrate;
a switching element on the substrate;
an insulating layer on the switching element;
a pixel defining film on the insulating layer and including an opening overlapping a part of the insulating layer;
a lower electrode on a side surface of the pixel defining film defining the opening and electrically connected with the switching element;
a reflective pattern on the insulating layer exposed through the opening and spaced apart from the lower electrode;
a light emitting layer on the lower electrode and the reflective pattern;
an upper electrode on the light emitting layer; and
a wavelength conversion layer on the upper electrode and arranged in the opening.

2. The display device of claim 1, wherein the lower electrode and the reflective pattern are made of a same material.

3. The display device of claim 2, wherein the reflective pattern is a floating pattern.

4. The display device of claim 1, wherein the lower electrode surrounds the reflective pattern in a plan view.

5. The display device of claim 1, wherein the insulating layer includes a groove including an upper portion having a smaller width than a width of a lower portion of the groove, and the groove is between the lower electrode and the reflective pattern.

6. The display device of claim 5, further comprising a conductive pattern in the groove and spaced apart from the lower electrode and the reflective pattern.

7. The display device of claim 6, wherein the conductive pattern, the lower electrode, and the reflective pattern are made of a same material.

8. The display device of claim 1, wherein the insulating layer includes a groove including an upper portion having a smaller width than a width of a lower portion of the groove, and the reflective pattern is in the groove.

9. The display device of claim 1, further comprising an insulation pattern on the insulating layer and arranged between the lower electrode and the reflective pattern,
wherein the insulation pattern includes an upper portion having a larger width than a width of a lower portion of the insulation pattern.

10. The display device of claim 9, further comprising a conductive pattern on the insulation pattern and spaced apart from the lower electrode and the reflective pattern.

11. The display device of claim 10, wherein the conductive pattern, the lower electrode, and the reflective pattern are made of a same material.

12. The display device of claim 1, further comprising an insulation pattern on the insulating layer and including an upper portion having a larger width than a width of a lower portion of the insulation pattern, wherein the reflective pattern is arranged on the insulation pattern.

13. The display device of claim 1, further comprising a bank pattern between the pixel defining film and the light emitting layer,
    wherein the bank pattern covers a portion overlapping an upper surface of the pixel defining film in the lower electrode.

14. The display device of claim 13, wherein the light emitting layer is a blue light emitting layer, and the wavelength conversion layer includes a quantum dot.

15. A display device comprising:
    a substrate including a first pixel area and a second pixel area adjacent to the first pixel area;
    a first switching element on the substrate and arranged in the first pixel area;
    a second switching element on the substrate and arranged in the second pixel area;
    an insulating layer on the first switching element and the second switching element;
    a pixel defining film on the insulating layer and including a first side surface defining a first opening exposing a part of the insulating layer in the first pixel area and a second side surface defining a second opening exposing a part of the insulating layer in the second pixel area;
    a first lower electrode on the first side surface and electrically connected with the first switching element;
    a second lower electrode on the second side surface and electrically connected with the second switching element;
    a first reflective pattern on the insulating layer exposed through the first opening and spaced apart from the first lower electrode;
    a second reflective pattern on the insulating layer exposed through the second opening and spaced apart from the second lower electrode;
    a light emitting layer on the first lower electrode, the second lower electrode, the first reflective pattern, and the second reflective pattern;
    an upper electrode on the light emitting layer;
    a first wavelength conversion layer on the upper electrode and arranged in the first opening; and
    a second wavelength conversion layer on the upper electrode and arranged in the second opening.

16. The display device of claim 15, wherein the first lower electrode, the second lower electrode, the first reflective pattern, and the second reflective pattern are made of a same material.

17. The display device of claim 15, wherein the light emitting layer is a blue light emitting layer, the first wavelength conversion layer includes a first quantum dot, and the second wavelength conversion layer includes a second quantum dot different from the first quantum dot.

18. The display device of claim 15,
    wherein the substrate further includes a third pixel area adjacent to the second pixel area, and
    the pixel defining film further includes a third opening in the third pixel area, and the display device further comprises a light transmitting layer on the upper electrode and arranged in the third opening.

19. The display device of claim 18, wherein the light transmitting layer includes a scattering material.

20. The display device of claim 18, further comprising:
    a third switching element on the substrate and arranged in the third pixel area; and
    a third lower electrode electrically connected with the third switching element,
    wherein the insulating layer is arranged between the third switching element and the third lower electrode,
    the light emitting layer is further arranged on the third lower electrode,
    the upper electrode is further arranged on the light emitting layer in the third pixel area, and
    the light transmitting layer is arranged on the upper electrode.

* * * * *